United States Patent
Mizumura et al.

(10) Patent No.: US 9,121,986 B2
(45) Date of Patent: Sep. 1, 2015

(54) MICROLENS ARRAY AND SCANNING EXPOSURE DEVICE USING SAME

(75) Inventors: Michinobu Mizumura, Yokohama (JP); Yoshio Watanabe, Yokohama (JP)

(73) Assignee: V TECHNOLOGY CO., LTD., Yokohama-Shi, Kanagawa (JP)

( * ) Notice: Subject to any disclaimer, the term of this patent is extended or adjusted under 35 U.S.C. 154(b) by 0 days.

(21) Appl. No.: 14/236,319

(22) PCT Filed: Jul. 27, 2012

(86) PCT No.: PCT/JP2012/069146
§ 371 (c)(1),
(2), (4) Date: Jan. 30, 2014

(87) PCT Pub. No.: WO2013/018699
PCT Pub. Date: Feb. 7, 2013

(65) Prior Publication Data
US 2014/0168622 A1  Jun. 19, 2014

(30) Foreign Application Priority Data
Aug. 3, 2011  (JP) ................................. 2011-170206

(51) Int. Cl.
G02B 3/08  (2006.01)
G02B 3/00  (2006.01)
(Continued)

(52) U.S. Cl.
CPC .......... *G02B 3/0056* (2013.01); *G03F 7/70275* (2013.01); *G03F 7/70308* (2013.01); *G03F 9/70* (2013.01)

(58) Field of Classification Search
CPC .. G02B 3/0056; G02B 3/0062; G02B 3/0068; G02B 27/0961; G03F 7/70358

USPC .................................. 359/619–622, 739–741
See application file for complete search history.

(56) References Cited

U.S. PATENT DOCUMENTS

| | | |
|---|---|---|
| 2010/0142057 A1 | 6/2010 | Nagata et al. |
| 2012/0236283 A1 | 9/2012 | Mizumura et al. |

(Continued)

FOREIGN PATENT DOCUMENTS

| | | |
|---|---|---|
| JP | 9-244255 A | 9/1997 |
| JP | 2007-3829 A | 1/2007 |

(Continued)

OTHER PUBLICATIONS

International Search Report (ISR) (PCT Form PCT/ISA/210) dated Oct. 30, 2012, in PCT/JP2012/069146.

*Primary Examiner* — James Phan
(74) *Attorney, Agent, or Firm* — McGinn IP Law Group, PLLC

(57) ABSTRACT

This microlens array comprises hexagonal field diaphragms in inverted-image-forming positions, i.e., microlenses, a plurality of which are arranged in the direction perpendicular to a direction of scanning, and from which rows of microlenses are configured. Further, for three rows of microlenses, microlens rows are arranged with offset by (a length S) in a direction perpendicular to the direction of scanning such that triangular portions of the hexagonal field diaphragms overlap in the direction of scanning. Furthermore, microlens row groups, which are configured from three microlens rows, are arranged with offset in the direction perpendicular to the direction of scanning in increments of a minute amount of shifting F (for example, 2 μm). Thereby, this scanning exposure device using a microlens array is capable of preventing exposure ununiformity even in the direction perpendicular to the direction of scanning.

17 Claims, 9 Drawing Sheets

(51) Int. Cl.
*G03F 7/20* (2006.01)
*G03F 9/00* (2006.01)

(56) References Cited

U.S. PATENT DOCUMENTS

2013/0208255 A1* 8/2013 Mizumura et al. .............. 355/71
2014/0152968 A1* 6/2014 Mizumura et al. .............. 355/67

FOREIGN PATENT DOCUMENTS

| JP | 2010-128361 A | | 6/2010 |
|----|---------------|---|--------|
| WO | WO 2011/068014 A1 | | 6/2011 |
| WO | WO 2012/056817 | * | 5/2012 |

* cited by examiner (a)

(b)

US 9,121,986 B2

MICROLENS ARRAY AND SCANNING EXPOSURE DEVICE USING SAME

TECHNICAL FIELD

The present invention relates to an exposure device in which a substrate is exposed through a mask pattern by a microlens array in which microlenses are two-dimensionally arrayed; the present invention also relates to a microlens array used therefor.

BACKGROUND ART

With thin-film transistor liquid crystal substrates, color filter substrates, and the like, a resist film or the like formed on a glass substrate is overlappingly exposed several times, to form a predetermined pattern. A scanning exposure device using a microlens array in which microlenses are two-dimensionally arranged has been recently proposed (patent document 1). In the scanning exposure device, a plurality of microlens arrays are arrayed in one direction, and the microlens arrays and an exposure light source are moved in a relative fashion with respect to the substrate and a mask, in a direction perpendicular to the direction of arraying, whereby the exposure light is scanned through the mask to form on the substrate an exposure pattern formed by holes in the mask. The microlens arrays are such that convex microlenses are formed on a front side and reverse side of four glass plates that are, for example, 4 mm thick, and the four microlens array units thus configured are overlaid so that the optical axes of each of the microlenses coincide, where arranging eight lenses in the optical axis direction causes the substrate to be exposed to an erect unmagnified image.

FIG. 4 is a longitudinal cross-sectional view illustrating an exposure device in which microlens arrays are used. FIG. 5 is a cross-sectional view illustrating a state of exposure by the microlens arrays. FIG. 6 is a perspective view illustrating a mode of arrangement of the microlens arrays. FIG. 7 is a cross-sectional view illustrating a part of a microlens array unit. FIG. 8 is a drawing illustrating a hexagonal field diaphragm of a microlens. FIG. 9 is a plan view illustrating the arrangement of the hexagonal field diaphragms of the microlenses. FIG. 10 is a drawing illustrating a spherical aberration.

As illustrated in FIG. 4, exposure light that is emitted from an exposure light source 4 is guided to a mask 3 via an optical system 21 comprising a plane mirror; a microlens array 2 is irradiated with exposure light that is transmitted through the mask 3, and the microlens array 2 forms on the substrate 1 a pattern that is formed by the mask 3. A dichroic mirror 22 is arranged on the optical path of the optical system 21, and an observation light coming from a camera 23 is reflected at the dichroic mirror 22 and directed toward the mask 3 coaxially with the exposure light coming from the exposure light source 4. The observation light is focused on the substrate 1 by the microlens array 2 and reflects a reference pattern previously formed on the substrate 1; the reflected light of the reference pattern is incident onto the camera 23 via the microlens array 2, the mask 3 and the dichroic mirror 22. The camera 23 detects the reflected light of the reference pattern and outputs a detection signal thereof to an image processing unit 24. The image processing unit 24 runs image processing on the detection signal of the reference pattern, and obtains a detected image of the reference pattern. The control unit 25 aligns the substrate 1, the microlens array 2, the mask 3, and the exposure light source 4 on the basis of the detected image. The microlens array 2, the exposure light source 4, and the optical system 21 can be moved in a certain direction as an integral unit, and the substrate 1 and the mask 3 are arranged in a fixed fashion. Movement of the substrate 1 and the mask 3 in one direction causes the exposure light to be scanned over the substrate; the full surface of the substrate is exposed by this scanning in cases of "single-take" substrates, in which a single substrate is produced from a glass substrate. An alternative possible configuration is for the glass substrate 1 and the mask 3 to be fixed, with the microlens array 2 and the light source 4 being moved in a certain direction as an integral unit. In such a case, the exposure light is moved over the substrate and scans the substrate surface.

Next, a mode of exposure by the microlens array shall be described in greater detail. As illustrated in FIG. 5, the microlens array 2, which is configured by two-dimensionally arranging the microlenses 2a, is arranged above an exposure substrate 1 such as a glass substrate; additionally, the mask 3 is arranged over the microlens array 2, and the exposure light source 4 is arranged over the mask 3. With the mask 3, a light-blocking film composed of a Cr film 3b is formed on a lower surface of a transparent substrate 3a, and the exposure light is transmitted through holes formed in the Cr film 3b and focused on the substrate by the microlens array 2. As described above, in the present embodiment, for example, the substrate 1 and the mask 3 are fixed and the microlens array 2 and the exposure light source 4 are synchronously moved in the direction of the arrow 5, whereby the exposure light coming from the exposure light source 4 is transmitted through the mask 3 and scanned in the direction of the arrow 5 over the substrate 1. Such movement of the microlens array 2 and the exposure light source 4 is driven by a drive source of an appropriate movement device.

As illustrated in FIG. 6, there are, for example, two rows of four microlens arrays 2 each arranged in a support substrate 6 in a direction perpendicular to a direction of scanning 5, the microlens arrays 2 being arrayed so that the two rows of the microlens arrays 2 are staggered with three of the four microlens arrays 2 of a later stage being arranged between the four microlens arrays 2 of an earlier stage, in a respective fashion, as seen in the direction of scanning 5. This causes the full range of an exposure region in a direction perpendicular to the direction of scanning 5 on the substrate 1 to be exposed by the two rows of the microlens arrays 2.

As illustrated in FIG. 7, each of the microlenses 2a of each of the microlens arrays 2 is a four-sheet eight-lens configuration and has a structure in which four microlens array units 2-1, 2-2, 2-3, 2-4 are layered. Each of the microlens array units 2-1 and so forth comprises an optical system represented by two convex lenses. This causes exposure light to be temporarily converged between the microlens array unit 2-2 and the microlens array unit 2-3, and further to form an image on a substrate that is below the microlens array unit 2-4. A hexagonal field diaphragm 12 is arranged between the microlens array unit 2-2 and the microlens array unit 2-3, and a circular aperture stop 10 is arranged between the microlens array unit 2-3 and the microlens array unit 2-4. The aperture stop 10 limits the numerical aperture (NA) of each of the microlenses 2a, and the hexagonal field diaphragm 12 narrows the field of view to a hexagon at close to an image-forming position. The hexagonal field diaphragm 12 and the aperture stop 10 are provided to each of the microlenses 2a, and for each of the microlenses 2a, the aperture stop 10 shapes a light transmission region of the microlens 2a to a circle, and a region of exposure of the exposure light on the substrate is also shaped to a hexagon. The hexagonal field diaphragm 12 is shaped, for example, to be a hexagonal opening in the aperture stop 10 of the microlenses 2a, as illustrated in FIG. 8. Accordingly, the hexagonal field diaphragm 12 causes only a region on the substrate 1 that is enclosed by the hexagon illustrated in FIG. 9 to be irradiated with the exposure light transmitted through the microlens arrays 2 when scanning is stopped. The hexagonal field diaphragm 12 and the circular aperture stop 10 can, however, be patterned using Cr films, as films that do not transmit light.

FIG. 9 is a drawing illustrating a mode of arrangement of the microlenses 2a, as positions of the hexagonal field diaphragms 12 of the microlenses 2a, in order to illustrate a mode of arrangement of each of the microlenses 2a in each of the microlens arrays 2. As illustrated in FIG. 9, the microlenses 2a are, with respect to the direction of scanning 5, arranged successively with an offset in a slightly transverse direction (a direction perpendicular to the direction of scanning 5). The hexagonal field diaphragms 12 are divided into a middle rectangular portion 12a and triangular portions 12b, 12c on both sides as seen in the direction of scanning 5. In FIG. 9, the dashed lines are line segments linking each of the corners of the hexagons of the hexagonal field diaphragm 12 in the direction of scanning 5. As illustrated in FIG. 9, with respect to rows in the direction perpendicular to the direction of scanning 5, when three rows of the hexagonal field diaphragms 12 are viewed in relation to the direction of scanning 5, the microlenses 2a are arranged so that the right-side triangular portions 12c of the hexagonal field diaphragms 12 of a given particular first row overlap with the left-side triangular portions 12b of the hexagonal field diaphragms 12 of a second row that is adjacent to the rear in the direction of scanning, and the left-side triangular portions 12b of the hexagonal field diaphragms 12 of the first row overlap with the right-side triangular portions 12c of the hexagonal field diaphragms 12 of a third row. In this manner, with respect to the direction of scanning 5, three rows of microlenses 2a are arranged so as to form a set. In other words, the fourth row of microlenses 2a are arranged at the same positions as those of the first row of microlenses 2a with respect to the direction perpendicular to the direction of scanning 5. Here, in three rows of hexagonal field diaphragms 12, when the surface area of the triangular portions 12b and surface area of the triangular portions 12c in two adjacent rows of hexagonal field diaphragms 12 are added together, then the linear density of the total surface area of the two triangular portions 12b, 12c overlapping in the direction of scanning 5 is the same as the linear density of the surface area of the middle rectangular portions 12a. The term "linear density" here refers to the aperture area of the hexagonal field diaphragms 12 per unit length in the direction perpendicular to the direction of scanning 5. In other words, the total surface area of the triangular portions 12b, 12c will be the surface area of the rectangular portions, where the base of the triangular portions 12b, 12c is the length and the height of the triangular portions 12b, 12c is the width. This rectangular portion is of the same length as the length of the rectangular portions 12a, and thus when compared by the aperture area (linear density) per unit length with respect to the direction perpendicular to the direction of scanning 5, the linear density of the triangular portions 12b, 12c and the linear density of the rectangular portions 12a are the same. For this reason, when the substrate 1 is subjected to scanning of three rows of the microlenses 2a, then the entire region will receive a uniform amount of exposure light with respect to the direction of scanning 5. As such, in each of the microlens arrays 2, a number of rows of microlenses 2a that is a whole-number multiple of three are arranged with respect to the direction of scanning 5, and this causes the entire region of the substrate to receive a uniform amount of the exposure light from one scan.

PRIOR ART DOCUMENTS

Patent documents

Patent document 1: Japanese laid-open patent publication 2007-3829

DISCLOSURE OF THE INVENTION

Problems the Invention is Intended to Solve

However, the following problems have emerged in the conventional scanning exposure device. As illustrated in FIG. 10, in each of the microlenses 2a, a spherical aberration exists at a peripheral portion of the lenses thereof, and the amount of light that is transmitted through the peripheral portion is less than the amount of light that is transmitted through the center portion. For this reason, the hexagonal field diaphragms 12 are provided between the second microlens array unit 2-2 and the third microlens array unit 2-3, light that is transmitted through the peripheral part of the microlenses 2a is blocked, and the spherical aberration of the peripheral part of the microlenses 2a is prevented.

However, though the spherical aberration of the lens peripheries can be removed to a certain extent by the hexagonal field diaphragms 12, the light that is transmitted through the hexagonal field diaphragms still has such a light amount distribution that the amount of light decreases from the center of the hexagonal field diaphragms 12 to the peripheral part. With this light amount distribution, because the microlenses 2a move in a relative fashion with respect to the direction of scanning 5 of the microlens arrays 2, the light amount distribution ends up being averaged and smoothed, and the impact of the light amount distribution does not remain at specific positions on the substrate. However, because the microlenses 2a do not move in a relative fashion with respect to the direction perpendicular to the direction of scanning 5 of the microlens arrays 2, the spherical aberration of one microlens 2a ends up causing the distribution of the light amount to remain on the substrate 1. For this reason, the prior art has the problem where an ununiformity of exposure occurs with respect to the direction perpendicular to the direction of scanning.

With the foregoing problem in view, it is an object of the present invention to provide a microlens array and a scanning exposure device using same with which an ununiformity of exposure can be prevented from occurring in the direction perpendicular to the direction of scanning, as well.

Means for Solving the Problems

A microlens array as in the present invention comprises:
a plurality of microlens array units, each of said units having a plurality of microlenses which are two-dimensionally arranged, said units being mutually layered; and
polygonal field diaphragms having polygonal apertures and being arranged at inverted-image-forming positions between said microlens array units;
wherein a plurality of said microlenses are arrayed at an interval of suitable length in a first direction to constitute microlens rows, and the plurality of microlens rows are arranged at an interval of suitable length in a second direction orthogonal to the first direction;
when a viewing field region defined by said polygonal field diaphragms is broken down into a rectangle and triangles on both sides thereof, then the triangular portion on one side, the rectangular portion, and the triangular portion on the other side are continuous in said first direction;
wherein each of microlens row groups is constituted by every one of said plurality of microlens rows, and, for each of said microlens row groups, said microlenses in each of said microlens rows are arranged with offset in said first direction so that said triangular portion on the one side overlaps in relation to a second direction with said triangular portion on the other side of another microlens in another microlens row adjacent in said second direction to the relevant microlens; and said microlens row groups are arranged in said first direction with an offset of a distance shorter than the length of said viewing field region in said first direction, with respect to another microlens row group adjacent thereto in said second direction.

A scanning exposure device using a microlens array as in the present invention comprises:

a microlens array which is arranged above a substrate to be exposed and comprises a plurality of mutually layered microlens array units in which a plurality of microlenses are two-dimensionally arranged, and polygonal field diaphragms having polygonal apertures and being arranged at inverted-image-forming positions between said microlens array units;

a mask which is arranged above the microlens arrays and on which a predetermined exposure pattern is formed;

an exposure light source for irradiating the mask with exposure light; and a movement device for moving said microlens arrays or said substrate and said mask in a relative fashion in one direction;

wherein a plurality of said microlenses are arrayed at an interval of suitable length in a first direction to constitute microlens rows, and the plurality of microlens rows are arranged at an interval of suitable length in a second direction orthogonal to the first direction;

when a viewing field region defined by said polygonal field diaphragms is broken down into a rectangle and triangles on both sides thereof, then the triangular portion on one side, the rectangular portion, and the triangular portion on the other side are continuous in said first direction;

wherein each of microlens row groups is constituted by every one of said plurality of microlens rows, and, for each of said microlens row groups, said microlenses in each of said microlens rows are arranged with offset in said first direction so that said triangular portion on the one side overlaps in relation to a second direction with said triangular portion on the other side of another microlens in another microlens row adjacent in said second direction to the relevant microlens; and said microlens row groups are arranged in said first direction with an offset of a distance shorter than the length of said viewing field region in said first direction, with respect to another microlens row group adjacent thereto in said second direction.

In the scanning exposure device using the microlens array, for example, the movement device could be configured to move the microlens arrays and the light source in the second direction with respect to the substrate and the mask.

Effects of the Invention

According to the present invention, in an exposure device using a microlens array, microlens rows are arranged with offset in a first direction by a distance shorter than the length of the viewing field region in the first direction, for every one of microlens groups of, for example, three rows, and therefore a distribution in the amount of light in the first direction created by the microlenses can be somewhat shifted in the first direction for every one of the microlens row groups of three rows. Thus, when scanning by the plurality of microlens row groups is received, a light amount distribution in the first direction on the substrate can be eliminated, and exposure ununiformity can be prevented.

BRIEF DESCRIPTION OF THE DRAWINGS

FIG. 11A illustrates the change in amount of light in two hexagonal field diaphragms, and FIG. 11B illustrates the change in amount of light in a plurality of groups of microlens rows.

BEST MODE FOR CARRYING OUT THE INVENTION

Figure 1:
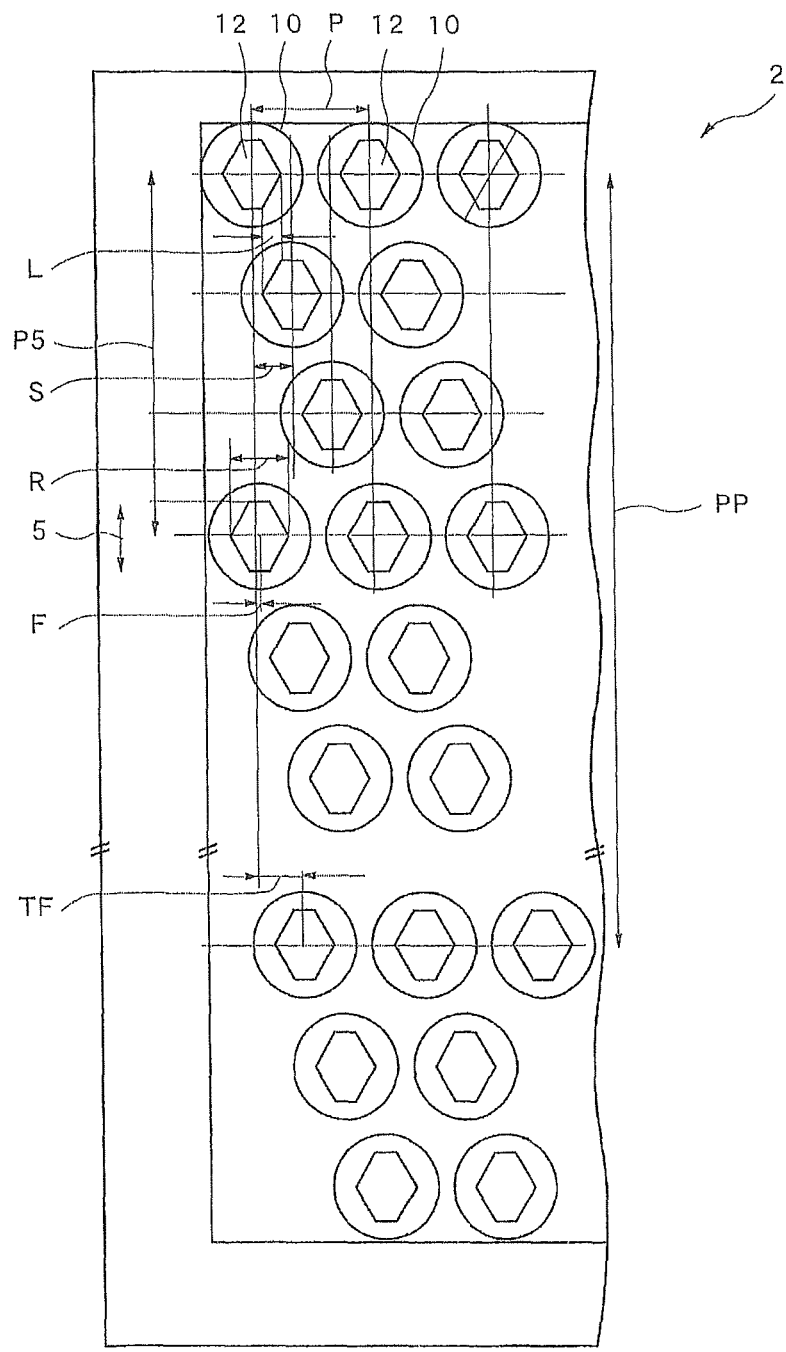
FIG. 1 is a plan view illustrating the arrangement of microlenses in a microlens array as in an embodiment of the present invention.

An embodiment of the present invention shall be described in detail below, with reference to the accompanying drawings. FIG. 1 is a plan view illustrating the arrangement of microlenses 2a in a microlens array 2 as in the embodiment of the present invention. In one microlens 2a, a hexagonal field diaphragm 12 is arranged inside a circular aperture stop 10, and exposure light is transmitted only through the region of the hexagonal field diaphragm 12. In the microlens array 2, a plurality of microlenses 2a are arranged at a lens pitch P in a direction perpendicular to a direction of scanning 5, thus constituting microlens rows. With the microlens rows, which extend in the direction perpendicular to the direction of scanning 5, adjacent microlens rows are offset from one another by an amount of shifting S in the direction perpendicular to the direction of scanning 5. Microlens row groups, which comprise three microlens rows, are arranged at a pitch P5 with respect to the direction of scanning 5, and the microlenses 2a in each of the microlens row groups have the same mode of arrangement.

Figure 9:
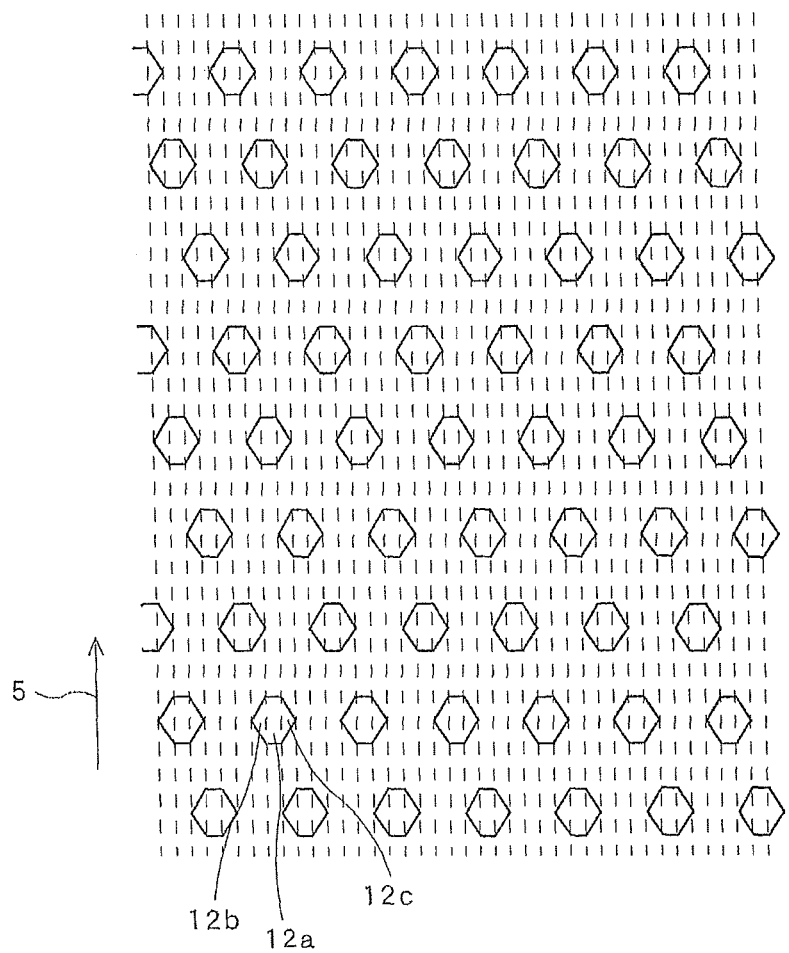
FIG. 9 is a plan view illustrating the arrangement of hexagonal field diaphragms of the microlenses.

In each of the microlens row groups, an amount of overlap L relating to the direction of scanning 5 between adjacent microlens rows is equivalent to the height of the triangular portions 12b and 12c in the hexagonal field diaphragms 12, as is described with FIG. 9. As such, when each of the microlens row groups (three microlens rows) scans the substrate in the direction of scanning 5, the substrate nominally (in a case where there is no spherical aberration) receives a uniform amount of exposure light, with respect to the direction perpendicular to the direction of scanning 5.

In the present embodiment, in every microlens row group (three microlens rows), the microlenses are offset by a minute amount of shifting F with respect to the direction perpendicular to the direction of scanning 5. The microlens row groups at both ends of the direction of scanning 5 are offset from one another in the direction perpendicular to the direction of scanning 5 by a total amount of shifting TF; this amount of shifting TF is n×F, where n is the number of microlens row groups. In FIG. 1, R is the maximum length of the hexagonal field diaphragms 12 in the direction perpendicular to the direction of scanning 5. PP is the pitch between the microlens row groups at both ends of the direction of scanning 5.

In such a case, preferably, when a maximum exposure region R of each of the microlenses is about 150 µm, then the minute amount of shifting F of offset in the direction perpendicular to the direction of scanning 5 for every microlens row group (for every three microlens rows) is, for example, about 2 µm. There are, for example, 75 of the microlens row groups arranged in the direction of scanning 5 in an ordinary microlens array 2. Then, the offset between the microlens row groups at both ends in the direction of scanning 5 would be 2 (µm)×75=150 (µm). Accordingly, the microlens row groups overall would have an offset commensurate with dimensions equivalent to the maximum exposure region R of each of the microlenses. It should be mentioned that the pitch P5 of each of the microlens row groups is, for example, 1.35 mm, and therefore the pitch PP between the microlens row groups of both ends in the direction of scanning 5 is 1.35 (mm)× 75=101.25 (mm); thus, the length of the microlens array 2 in the direction of scanning 5 is PP+P5=102.6 mm.

In a case where the offset S of the microlenses in the direction perpendicular to the direction of scanning 5 between adjacent microlens rows is, for example, 150 µm, then there would be two sets of adjacent microlens rows present in one microlens row group, and therefore the offset therebetween would be 150 (µm)×2=300 (µm), and the offset between a final microlens row and the adjacent microlens row group would also be 150 µm; therefore, in one microlens row group, the microlenses are offset by a total 450 µm. Also, between adjacent microlens row groups, the microlenses would be offset in the direction perpendicular to the direction of scanning 5 by a minute offset F (for example, 2 µm), and therefore the microlenses are offset by 450+2=452 (µm) between adjacent microlens row groups.

A configuration for the microlens arrays 2 and the exposure device other than this mode of arrangement of the microlenses 2a in the microlens arrays 2 can be configured similarly with respect to what is illustrated in FIGS. 4 to 9.

Next, the operation of the microlens arrays and the exposure device in the present embodiment, configured as described above, shall be described. For example, the substrate 1 and a mask 3 have been fixed, and the microlens arrays 2 and a light source 4 are moved in the direction of scanning 5 with respect to the substrate 1 and the mask 3. Then, in relation to the direction perpendicular to the direction of scanning 5, the substrate 1: first is irradiated with the exposure light that has been transmitted through the hexagonal field diaphragms 12 of one microlens row in which the microlenses are arrayed in the direction perpendicular to the direction of scanning 5; next is irradiated with the exposure light that has been transmitted through the hexagonal field diaphragms 12 of the subsequent microlens row; and further is irradiated with the exposure light that has been transmitted through the hexagonal field diaphragms 12 of the subsequent microlens row. Here, in relation to the direction perpendicular to the direction of scanning 5, the substrate is irradiated with the exposure light by the three microlens rows with continuing portions of one rectangular portion, two triangular portions, one rectangular portion, two triangular portions, one rectangular portion, and so forth. The total surface area of two triangular portions is equal to the surface area of a rectangular portion, which is equivalent to the height of the triangular portions, and thus, in the end, the substrate continuously receives a uniform amount of exposure light, in relation to the direction perpendicular to the direction of scanning 5, from the three microlens rows (microlens row group). Conventionally, the same substrate position would be exposed, in relation to the direction perpendicular to the direction of scanning 5, by all of the microlens row groups composed of these three microlens rows, as illustrated in FIG. 9.

Figure 10:
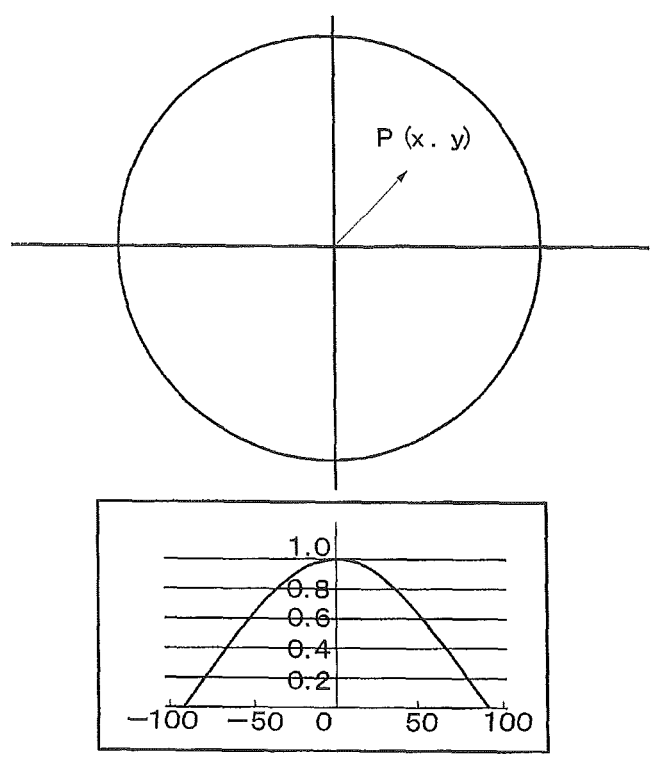
FIG. 10 is a drawing illustrating the spherical aberration of a microlens.
Figure 11:
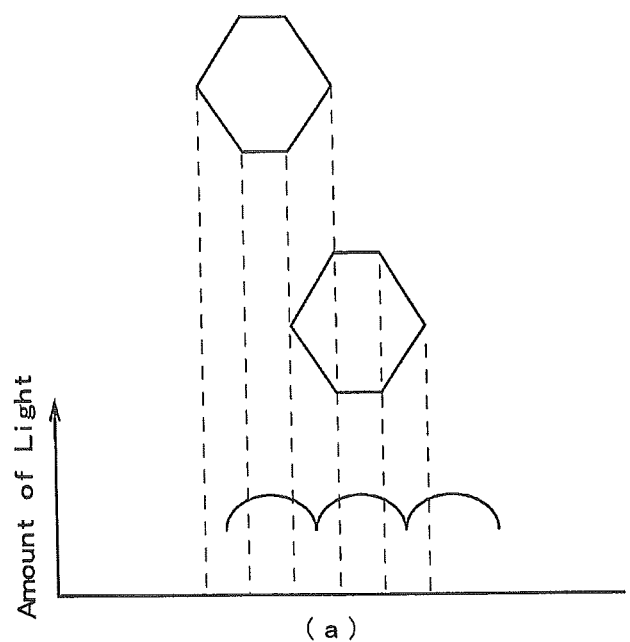
FIG. 11 is a drawing illustrating an effect of the present invention, where
Figure 11:
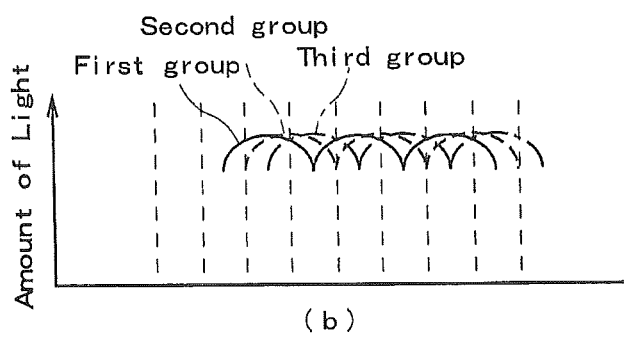

The conventional mode of arrangement of the microlenses illustrated in FIG. 9 allows for the entire region of the substrate to be exposed uniformly without gaps, provided that no spherical aberration is present in the microlenses. As described above, however, a spherical aberration such as is illustrated in FIG. 10 is present in each of the microlenses. That is to say, the amount of transmitted light decreases going from the center of the hexagonal field diaphragms 12 toward the peripheral part. In microlens rows that are adjacent in the direction of scanning 5, the triangular portions of the hexagonal field diaphragms 12 expose with duplication of the same portions of the substrate, and therefore, as illustrated in FIG. 11A, the peripheral edges of the hexagonal field diaphragms 12 will, in relation to the direction perpendicular to the direction of scanning 5, have a light amount distribution obtained when the triangular portions where the amount of exposure light decreases and the triangular portions where the amount of exposure light increases are added together. Thus, the changes in the amount of exposure light are somewhat canceled out, and, as illustrated in FIG. 11A, the magnitude of changes in the amount of light is somewhat smaller, though there is an undulating light amount distribution in relation to the direction perpendicular to the direction of scanning 5.

Figure 2:
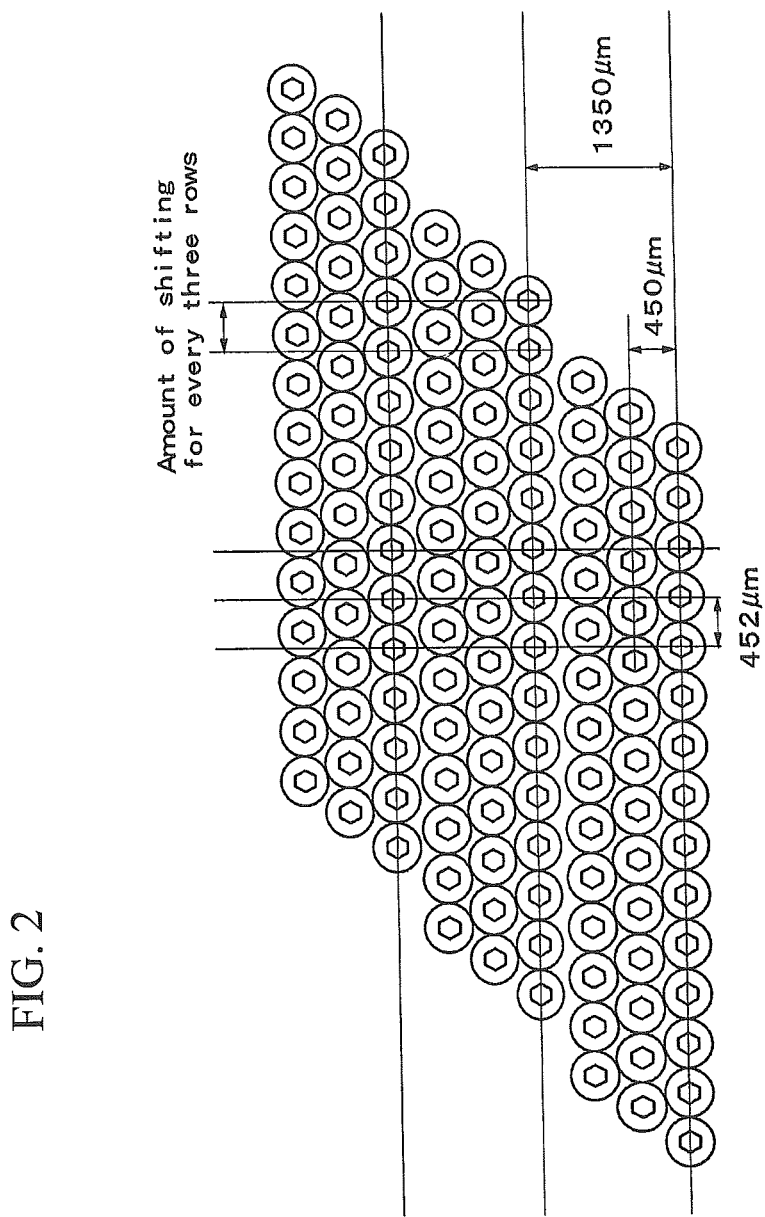
FIG. 2 is a plan view likewise illustrating the arrangement of microlenses.

In a case where the microlenses are arrayed as illustrated in the conventional example in FIG. 9, then each of the microlens row groups exposes with unaltered overlapping of the same light amount distribution as the light amount distribution in FIG. 11A, and ultimately the light amount distribution of exposure light on the substrate remains unaltered. In the present invention, however, because each of the microlens row groups that are adjacent to one another is offset by the minute amount of shifting F, as illustrated in FIGS. 1 and 2, as regards the light amount distribution of exposure light from each of the groups, the light amount distribution of FIG. 11A is shifted by increments of F in the direction perpendicular to the direction of scanning 5 with the first group, the third group, the second group, and so forth, as shown in FIG. 11B. For this reason, in a case where all of the, for example, 75 microlens row groups in FIG. 1 expose the substrate, then the ununiformity of the light amount distribution of exposure light is smoothed and becomes uniform, as shown in FIG. 11(b). Accordingly, a distribution of the amount of exposure light that is uniform in the direction perpendicular to the direction of scanning 5 is obtained, and ununiformity of exposure can be prevented. The direction of scanning 5 does have a distribution of the amount of exposure light in each of the microlenses, but this light amount distribution moves in the direction of scanning 5, and thus the ununiformity of the light amount distribution is smoothed; therefore, none of the ununiformity of the light amount distribution remains on the substrate after scanning.

Figure 3:
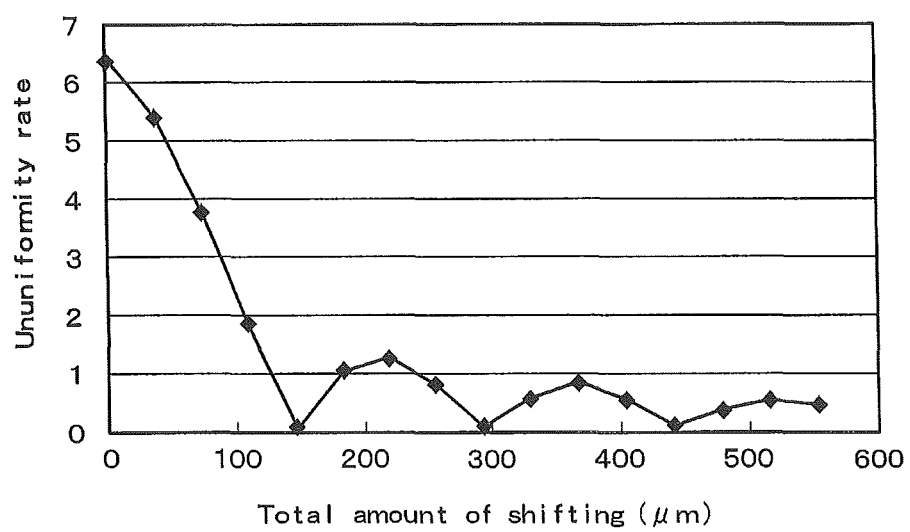
FIG. 3 is a graph diagram illustrating an effect of the present invention.
Figure 4:
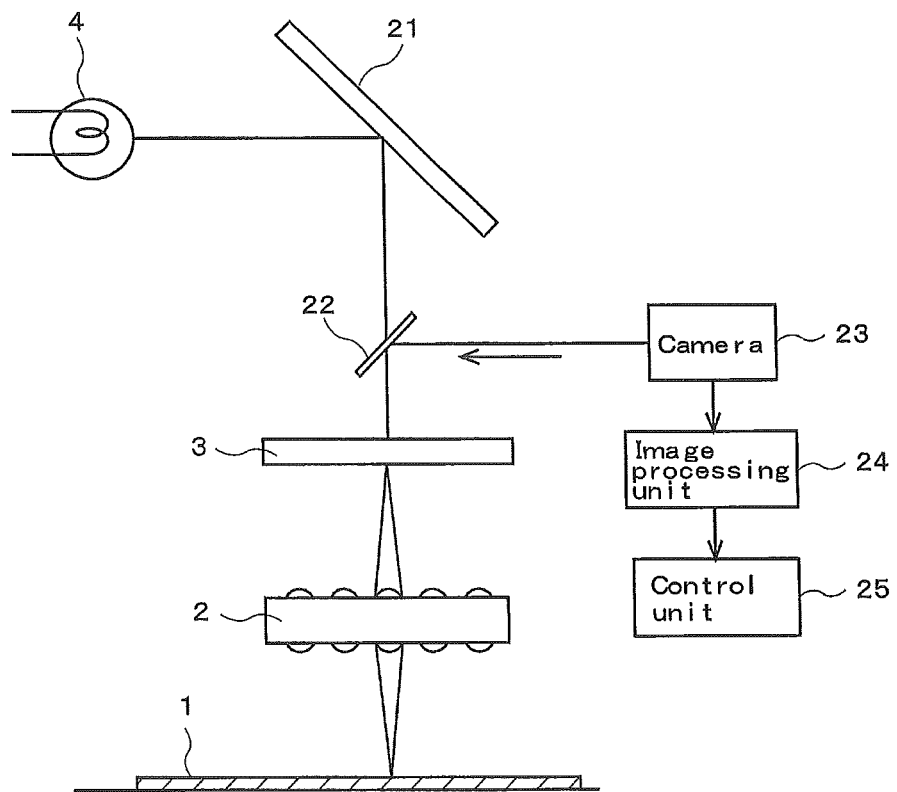
FIG. 4 is a schematic diagram illustrating an exposure device using the microlens arrays.
Figure 5:
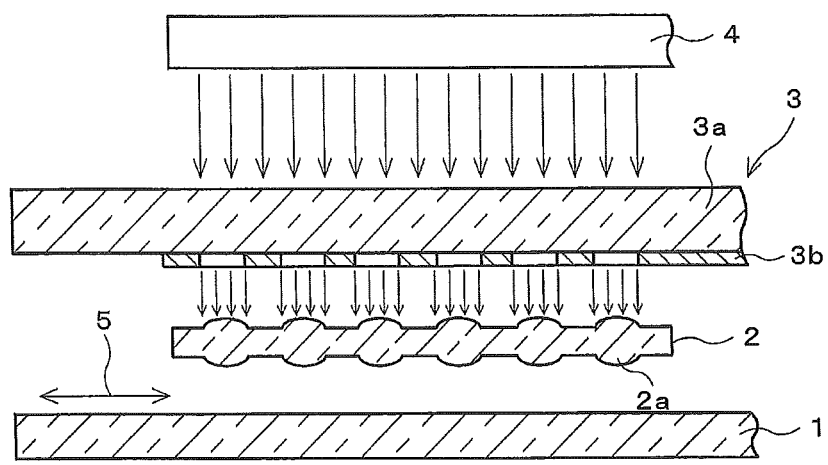
FIG. 5 is a longitudinal cross-sectional view likewise illustrating a portion of the microlens arrays in the exposure device.
Figure 6:
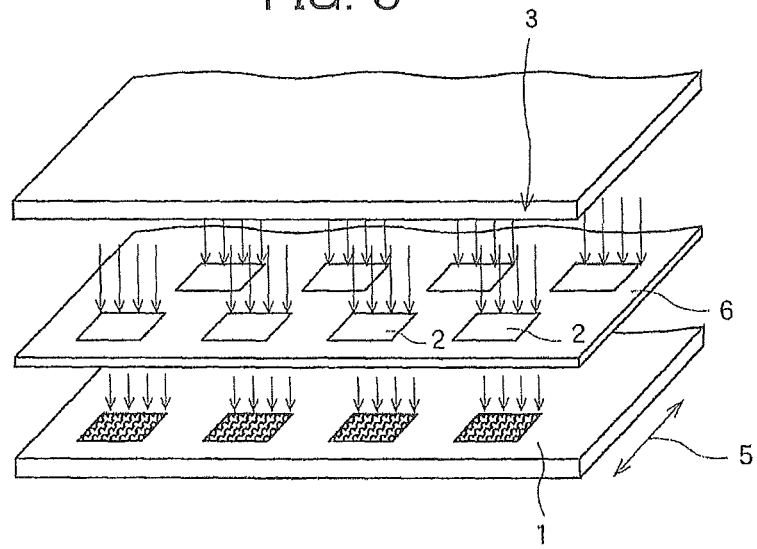
FIG. 6 is a perspective view illustrating a state where a plurality of the microlens arrays are arrayed.
Figure 7:
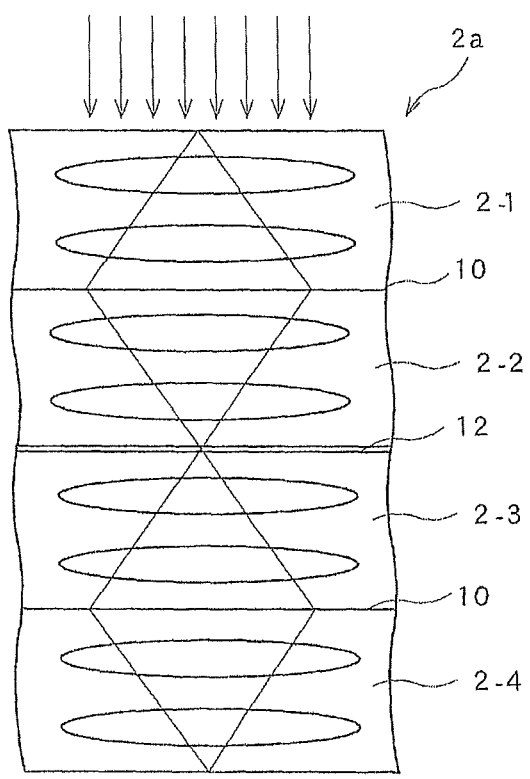
FIG. 7 is a drawing illustrating a microlens of a four-sheet configuration.
Figure 8:
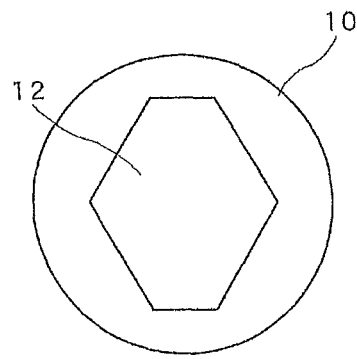
FIG. 8 is a drawing illustrating the shape of a diaphragm of the microlenses.

FIG. 3 is a graph simulating the relationship between the total amount of shifting TF and the proportion of exposure ununiformity (an ununiformity rate), where the horizontal axis is the total amount of shifting and the vertical axis is the ununiformity rate. The numerical values of the ununiformity rate illustrated in FIG. 2 relate to a case where the relationships of arrangement of the microlenses are the dimensions illustratively exemplified in FIG. 2. As illustrated in FIG. 3, in a case where the microlens row groups are not shifted (a case where the total amount of shifting TF is zero), then an exposure ununiformity rate of 6% or greater exists, whereas in a case where the total amount of shifting TF is 150 μm, i.e., a case where the total amount of shifting TF is close to the maximum exposure width R(=150 μm) of each of the microlenses, then the ununiformity of the distribution of the amount of exposure light becomes substantially zero, and the ununiformity rate of the amount of exposure light comes very close to 0%.

In a case where the total amount of shifting TF is a whole-number multiple of 150 μm, the distribution of the amount of exposure light is still substantially zero, and exposure ununiformity can also still be prevented. This is because the distribution of the amount of exposure light present within the maximum exposure width R of the microlenses is canceled out by the fact that the positions of the microlenses are offset by either the maximum exposure width R of the microlenses of a whole-number multiple thereof in the entirety of the direction of scanning 5. In a transition from an arrangement of the microlenses in which the exposure light amount distribution reaches a value close to zero, to a state where the total amount of shifting TF increases even more, i.e., a state where the microlens groups are increased, a distribution of the amount of exposure light appears anew commensurate with the increase in microlens row groups, and therefore the ununiformity rate increases. Accordingly, it is preferable to decide on an arrangement of the microlenses such that the total amount of shifting TF is matched to the maximum exposure width R of the microlenses.

Figure 12:
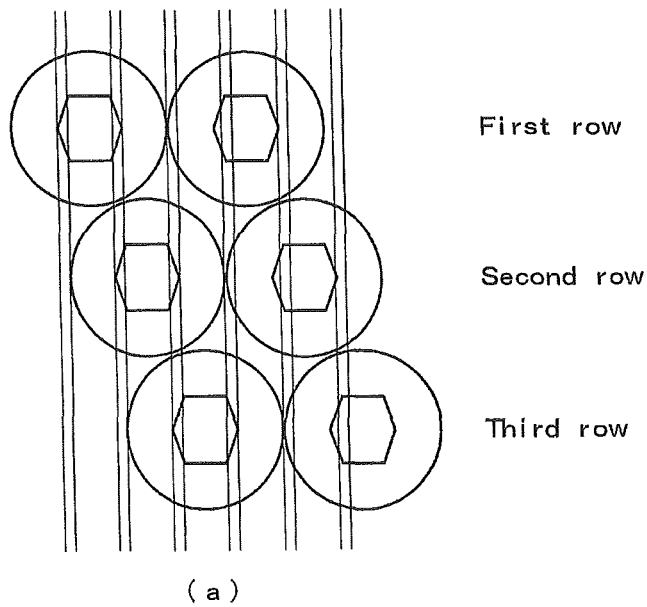
FIGS. 12A and 12B are drawings illustrating arrangements of microlenses in a three-row configuration and four-row configuration, respectively.
Figure 12:
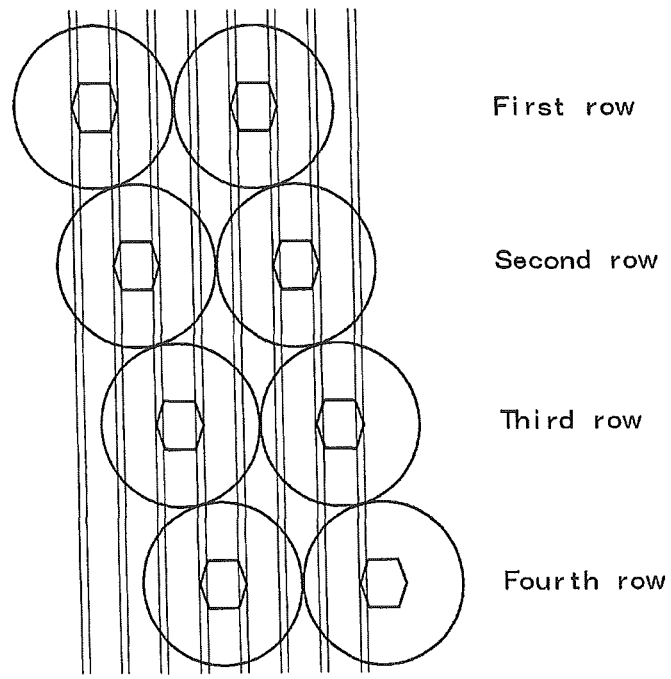

In the embodiment above, the polygonal field diaphragms are the hexagonal field diaphragms 12, and every three microlens rows constitutes a microlens row group, but the present invention is not limited thereto, and a variety of modes are possible. For example, the polygonal field diaphragms that define the field of view on the substrate by the microlenses are not limited to being hexagonal field diaphragms, and, for example, the apertures may be diamond-shaped, parallelogram-shaped, trapezoid-shaped, or the like. For example, with trapezoid-shaped (quadrangular) viewing field diaphragms, the viewing field region can still be broken down into a middle rectangular portion and the triangular portions on both sides thereof. Also, the microlens rows that constitute one microlens row group are not limited to being three in number; for example, in the case of the trapezoid-shaped and parallelogram-shaped (horizontally long) apertures, one group would be constituted for every three rows, but in the case of the diamond-shaped and parallelogram-shaped (vertically long) apertures, one group would be constituted for every two rows. Further, the arraying of the microlenses illustrated in FIG. 9 had one group comprising three rows in relation to the direction of scanning 5, as illustrated in FIG. 12A, and the fourth microlens row was arranged at the same position, in relation to the direction perpendicular to the direction of scanning 5, as the first microlens row, but in some instances the ratio of the lens pitch interval and viewing field width would be modified, because the lens size and viewing field width (hexagonal field diaphragm width) vary depending on the designed lens performance. In such a case, there would also arise instances where a three-row configuration is not adopted when the lens pitch is not a whole-number multiple of the viewing field width, as illustrated in FIG. 12B.

INDUSTRIAL APPLICABILITY

Being able to prevent the incidence of exposure ununiformity even in the direction perpendicular to the direction of scanning in cases where it is necessary to overlappingly expose a resist film formed on a glass substrate or the like, several times, to form a predetermined pattern, as with scanned exposure of thin-film transistor liquid crystal substrates, color filter substrates, and the like, the present invention can therefore be applied to superimposed exposure.

Key
1: Substrate
2: Microlens array
2a: Microlens
2-1 to 2-4: Microlens array unit
3: Mask
3a: Transparent substrate
3b: Cr film
4: Exposure light source
5: Direction of scanning
6: Support substrate
10: Circular aperture stop
12: Hexagonal field diaphragm
12a: Rectangular portion
12b, 12c: Triangular portion

What is claimed is:

1. A microlens array, comprising:
a plurality of microlens array units, each of said units including a plurality of microlenses which are two-dimensionally arranged, said units being mutually layered; and
polygonal field diaphragms including polygonal apertures and being arranged at inverted-image-forming positions between said microlens array units,
wherein a plurality of said microlenses are arrayed at an interval of suitable length in a first direction to constitute microlens rows, and the plurality of microlens rows are arranged at an interval of suitable length in a second direction orthogonal to the first direction,
wherein, when a viewing field region defined by said polygonal field diaphragms is broken down into a rectangle and triangles on both sides thereof, then the triangular portion on one side, the rectangular portion, and the triangular portion on an other side are continuous in said first direction,
wherein each of microlens row groups is constituted by every one of said plurality of microlens rows, and, for each of said microlens row groups, said microlenses in each of said microlens rows are arranged with offset in said first direction so that said triangular portion on the one side overlaps in relation to a second direction with said triangular portion on the other side of another microlens in another microlens row adjacent in said second direction to the relevant microlens, and
wherein said microlens row groups are arranged in said first direction with an offset of a distance shorter than a length of said viewing field region in said first direction, with respect to another microlens row group adjacent thereto in said second direction.

2. The microlens array as set forth in claim 1, wherein said each of microlens row groups comprises three rows of the microlens rows such that said microlenses in said each of microlens row groups have a same mode of arrangement.

3. The microlens array as set forth in claim 1, wherein the microlens row groups at both ends of said microlenses in the second direction are offset from one another in the first direction by a total amount of the distance of the offset times a number of the microlens row groups.

4. The microlens array as set forth in claim 1, wherein, with respect to a line that in the second direction contacts a first microlens of said microlenses in a first one of the microlens row groups, in the first direction, a first microlens of said microlenses in a second one of the microlens row groups is spaced apart from the line by an amount of the distance of the offset.

5. The microlens array as set forth in claim 1, wherein, with respect to a line that in the second direction contacts a first microlens of said microlenses in a first one of the microlens row groups, in the first direction, a first microlens of said microlenses in a last one of the microlens row groups is spaced apart from the line by an amount of the distance of the offset times a number of the microlens row groups.

6. The microlens array as set forth in claim 1, wherein, with respect to a line that in the second direction contacts a first microlens of said microlenses in a first one of the microlens row groups, in a second one of the microlens row groups, in the first direction, each microlens of said microlenses is spaced apart from the line.

7. The microlens array as set forth in claim 1, wherein, with respect to a line that in the second direction contacts a first microlens of said microlenses in a first one of the microlens row groups, in said each of microlens row groups, each of a remaining microlenses of said microlenses is spaced apart from the line.

8. The microlens array as set forth in claim 1, wherein, with respect to a line that in the second direction contacts a first microlens of said microlenses in a first one of the microlens row groups, in said each of microlens row groups, each of a remaining microlenses of said microlenses is spaced apart from the line at least by an amount of the distance of the offset.

9. A scanning exposure device, comprising:
a microlens array which is arranged above a substrate to be exposed and comprises a plurality of mutually layered microlens array units in which a plurality of microlenses are two-dimensionally arranged, and polygonal field diaphragms including polygonal apertures and being arranged at inverted-image-forming positions between said microlens array units;
a mask which is arranged above the microlens arrays and on which a predetermined exposure pattern is formed;
an exposure light source for irradiating the mask with exposure light; and
a movement device for moving said microlens arrays or said substrate and said mask in a relative fashion in one direction,
wherein a plurality of said microlenses are arrayed at an interval of suitable length in a first direction to constitute microlens rows, and the plurality of microlens rows are arranged at an interval of suitable length in a second direction orthogonal to the first direction,
wherein, when a viewing field region defined by said polygonal field diaphragms is broken down into a rectangle and triangles on both sides thereof, then the triangular portion on one side, the rectangular portion, and the triangular portion on an other side are continuous in said first direction,
wherein each of microlens row groups is constituted by every one of said plurality of microlens rows, and, for each of said microlens row groups, said microlenses in each of said microlens rows are arranged with offset in said first direction so that said triangular portion on the one side overlaps in relation to a second direction with said triangular portion on the other side of another microlens in another microlens row adjacent in said second direction to the relevant microlens, and
wherein said microlens row groups are arranged in said first direction with an offset of a distance shorter than a length of said viewing field region in said first direction, with respect to another microlens row group adjacent thereto in said second direction.

10. The scanning exposure device using the microlens array as set forth in claim 9, wherein the movement device moves said microlens arrays and a light source in said second direction with respect to said substrate and said mask.

11. The scanning exposure device using the microlens array as set forth in claim 9, wherein said each of microlens row groups comprises three rows of the microlens rows such that said microlenses in said each of microlens row groups have a same mode of arrangement.

12. The scanning exposure device using the microlens array as set forth in claim 9, wherein the microlens row groups at both ends of said microlenses in the second direction are offset from one another in the first direction by a total amount of the distance of the offset times a number of the microlens row groups.

13. The scanning exposure device using the microlens array as set forth in claim 9, wherein, with respect to a line that in the second direction contacts a first microlens of said microlenses in a first one of the microlens row groups, in the first direction, a first microlens of said microlenses in a second one of the microlens row groups is spaced apart from the line by an amount of the distance of the offset.

14. The scanning exposure device using the microlens array as set forth in claim 9, wherein, with respect to a line that in the second direction contacts a first microlens of said microlenses in a first one of the microlens row groups, in the first direction, a first microlens of said microlenses in a last one of the microlens row groups is spaced apart from the line by an amount of the distance of the offset times a number of the microlens row groups.

15. The scanning exposure device using the microlens array as set forth in claim 9, wherein, with respect to a line that in the second direction contacts a first microlens of said microlenses in a first one of the microlens row groups, in a second one of the microlens row groups, in the first direction, each microlens of said microlenses is spaced apart from the line.

16. The scanning exposure device using the microlens array as set forth in claim 9, wherein, with respect to a line that in the second direction contacts a first microlens of said microlenses in a first one of the microlens row groups, in said each of microlens row groups, each of a remaining microlenses of said microlenses is spaced apart from the line.

17. The scanning exposure device using the microlens array as set forth in claim 9, wherein, with respect to a line that in the second direction contacts a first microlens of said microlenses in a first one of the microlens row groups, in said each of microlens row groups, each of a remaining microlenses of said microlenses is spaced apart from the line at least by an amount of the distance of the offset.

* * * * *